United States Patent
Kodama et al.

(10) Patent No.: US 9,097,766 B2
(45) Date of Patent: Aug. 4, 2015

(54) ELECTROMAGNETIC OPENING/CLOSING DEVICE

(75) Inventors: Kazuhiro Kodama, Hokkaido (JP); Takeshi Okada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 82 days.

(21) Appl. No.: 14/004,892

(22) PCT Filed: Mar. 9, 2012

(86) PCT No.: PCT/JP2012/056101
§ 371 (c)(1),
(2), (4) Date: Sep. 12, 2013

(87) PCT Pub. No.: WO2012/128075
PCT Pub. Date: Sep. 27, 2012

(65) Prior Publication Data
US 2014/0002092 A1 Jan. 2, 2014

(30) Foreign Application Priority Data

Mar. 22, 2011 (JP) .................................. 2011-063233

(51) Int. Cl.
| | |
|---|---|
| *G01R 31/327* | (2006.01) |
| *H01H 71/04* | (2006.01) |
| *H01H 1/00* | (2006.01) |
| *H01H 47/00* | (2006.01) |

(Continued)

(52) U.S. Cl.
CPC .......... *G01R 31/327* (2013.01); *G01R 31/3278* (2013.01); *H01H 1/0015* (2013.01);
(Continued)

(58) Field of Classification Search
CPC . H01H 1/0015; H01H 50/045; H01H 47/002; G01R 31/3278; G01R 31/327; G01R 31/3274
USPC ................... 324/418, 424, 420, 423
See application file for complete search history.

(56) References Cited

U.S. PATENT DOCUMENTS

| | | | |
|---|---|---|---|
| 5,754,387 | A | 5/1998 | Tennies et al. |
| 7,423,504 | B2 | 9/2008 | Kon et al. |

(Continued)

FOREIGN PATENT DOCUMENTS

| | | |
|---|---|---|
| JP | 2-146736 U | 12/1990 |
| JP | 03-226934 A | 7/1991 |

(Continued)

OTHER PUBLICATIONS

International Search Report issued in PCT/JP2012/056101 with Date of mailing May 15, 2012.

*Primary Examiner* — Amy He
(74) *Attorney, Agent, or Firm* — McDermott Will & Emery LLP

(57) ABSTRACT

An electromagnetic opening/closing device comprises: a measurement part that measure a change associated with opening/closing of a contact (the number of times the contact has been opened or closed); a life determining part that determines a state of the contact, based on the change (the number of times the contact has been opened or closed) measured by the measurement part; and an output part that outputs the determined result by the life determining part to outside. Accordingly, differently from the conventional technique, an apparatus, equipped with the electromagnetic opening/closing device, has no need to count the number of times the contact has been opened or closed in order to manage the lifetime of the device, and it is possible to easily manage the lifetime compared with conventional devices.

13 Claims, 10 Drawing Sheets

(51) Int. Cl.
*H01H 50/54* (2006.01)
*H01H 9/00* (2006.01)
*H01H 36/00* (2006.01)

(52) U.S. Cl.
CPC ............ *H01H47/002* (2013.01); *H01H 50/54* (2013.01); *H01H 50/541* (2013.01); *H01H 71/04* (2013.01); *H01H 9/0066* (2013.01); *H01H 36/0046* (2013.01); *H01H 50/545* (2013.01)

(56) References Cited

U.S. PATENT DOCUMENTS 7,705,601 B2 * 4/2010 Zhou et al. .................. 324/424
8,103,460 B2 * 1/2012 Chen et al. .................. 702/34
2006/0226935 A1 10/2006 Kon et al.

FOREIGN PATENT DOCUMENTS

| | | |
|---|---|---|
| JP | 05-120945 A | 5/1993 |
| JP | 06-086360 A | 3/1994 |
| JP | 08-235951 A | 9/1996 |
| JP | 10-092283 A | 4/1998 |
| JP | 10-092282 A | 10/1998 |
| JP | 2003-346620 A | 12/2003 |
| JP | 2004-186052 A | 7/2004 |
| JP | 2006-294459 A | 10/2006 |
| JP | 2009-230921 A | 10/2009 |
| JP | 2010-103099 A | 5/2010 |

* cited by examiner

ELECTROMAGNETIC OPENING/CLOSING DEVICE

RELATED APPLICATIONS

This application is the U.S. National Phase under 35 U.S.C. §371 of International Application No. PCT/JP2012/056101, filed on Mar. 9, 2012, which in turn claims the benefit of Japanese Application No. 2011-063233, filed on Mar. 22, 2011, the disclosures of which are incorporated by reference herein.

TECHNICAL FIELD

The invention relates to an electromagnetic opening/closing device, such as an electromagnetic relay.

BACKGROUND ART

Conventionally, there is an electromagnetic opening/closing device, which is disclosed in the following Patent literature 1 for example. In the electromagnetic opening/closing device described in the Patent literature 1, a relay unit (electromagnetic relay) is housed within a casing made of synthetic resin, and a pair of main terminals and a pair of coil terminals are located so as to project at the casing. In this case, the pair of main terminals is connected to a contact of the relay unit, and a pair of coil terminals is connected to a coil used for an electromagnet of the relay unit. Further, the pair of main terminals is connected to a power-feeding path through which the electric power is supplied from an electric power source to a load. While excitation current flows between the pair of coil terminals, the relay unit (electromagnetic opening/closing device) turns on. While no excitation current flows between the pair of coil terminals, the relay unit (electromagnetic opening/closing device) turns off. That is, the power-feeding path from the electric power source to the load is closed, when the electromagnetic opening/closing device turns on, and is opened, when the electromagnetic opening/closing device turns off.

PRIOR ART DOCUMENTS

Patent Literature

Patent literature 1: Japanese Patent Application Publication No. 2009-230921

SUMMARY OF THE INVENTION

Problems to be Resolved by the Invention

Here, the above-mentioned electromagnetic opening/closing device is set to have a lifetime according to the operation frequencies of the relay unit (the number of times a contact has been opened or closed) mainly, and it is considered that the failure rate increases rapidly after the device reaches the lifetime. Accordingly, for using the electromagnetic opening/closing device safely and properly, it is important to manage the lifetime of the electromagnetic opening/closing device.

However, in the conventional electromagnetic opening/closing device, an apparatus, equipped with the device, has needed to count the number of times the contact has been opened or closed for example, in order to manage the lifetime of the device.

With the foregoing in view, it is an object of the present invention to provide an electromagnetic opening/closing device, which can easily manage the lifetime compared with conventional devices.

Means of Solving the Problems

An electromagnetic opening/closing device of the present invention opens or closes a contact in response to a command from outside, and comprises: a measurement means configured to measure a change associated with the opening/closing of the contact; a determining means configured to determine a state of the contact, based on the change measured by the measurement means; and an output means configured to output the determined result by the determining means to outside.

In the electromagnetic opening/closing device, it is preferred that the measurement means is configured to measure the number of times the contact has been opened or closed.

In the electromagnetic opening/closing device, it is preferred that the measurement means is configured to measure the number of times the contact has been opened or closed, based on the number of times the command has been inputted.

It is preferred that the electromagnetic opening/closing device further comprises an auxiliary contact interlocking with the opening/closing of the contact, wherein the measurement means is configured to measure the number of times the contact has been opened or closed, based on the number of times the auxiliary contact has been opened or closed.

It is preferred that the electromagnetic opening/closing device further comprises an electromagnet, wherein the contact comprises a fixed contact and a movable contact, the electromagnet making the movable contact come into contact with or separate from the fixed contact, using electromagnetic force, and wherein the measurement means is configured to measure the number of times the contact has been opened or closed, based on a change in an impedance of a coil that constitutes the electromagnet.

It is preferred that the electromagnetic opening/closing device further comprises a displacement means, wherein the contact comprises a fixed contact and a movable contact, the displacement means being configured to displace the movable contact, and wherein the measurement means is configured to measure the number of times the contact has been opened or closed, based on the displacement of the movable contact by the displacement means.

It is preferred that the electromagnetic opening/closing device further comprises a displacement means, wherein the contact comprises a fixed contact and a movable contact, the displacement means being configured to apply an external force to displace the movable contact, and wherein the measurement means is configured to measure the number of times of the contact has been opened or closed, based on a strain caused by the external force applied by the displacement means.

In the electromagnetic opening/closing device, it is preferred that the measurement means is configured to measure the number of times the contact has been opened or closed, based on a voltage applied across the contact.

In the electromagnetic opening/closing device, it is preferred that the determining means is configured to determine the state of the contact, based on the number of times the contact has been opened or closed per predetermined period.

In the electromagnetic opening/closing device, it is preferred that the measurement means is configured to measure an accumulated time during which the contact is closed.

Effect of the Invention

An electromagnetic opening/closing device of the present invention provides an effect of being capable of easily managing the lifetime compared with conventional devices.

BEST MODE FOR CARRYING OUT THE INVENTION

First Embodiment

Figure 1A:
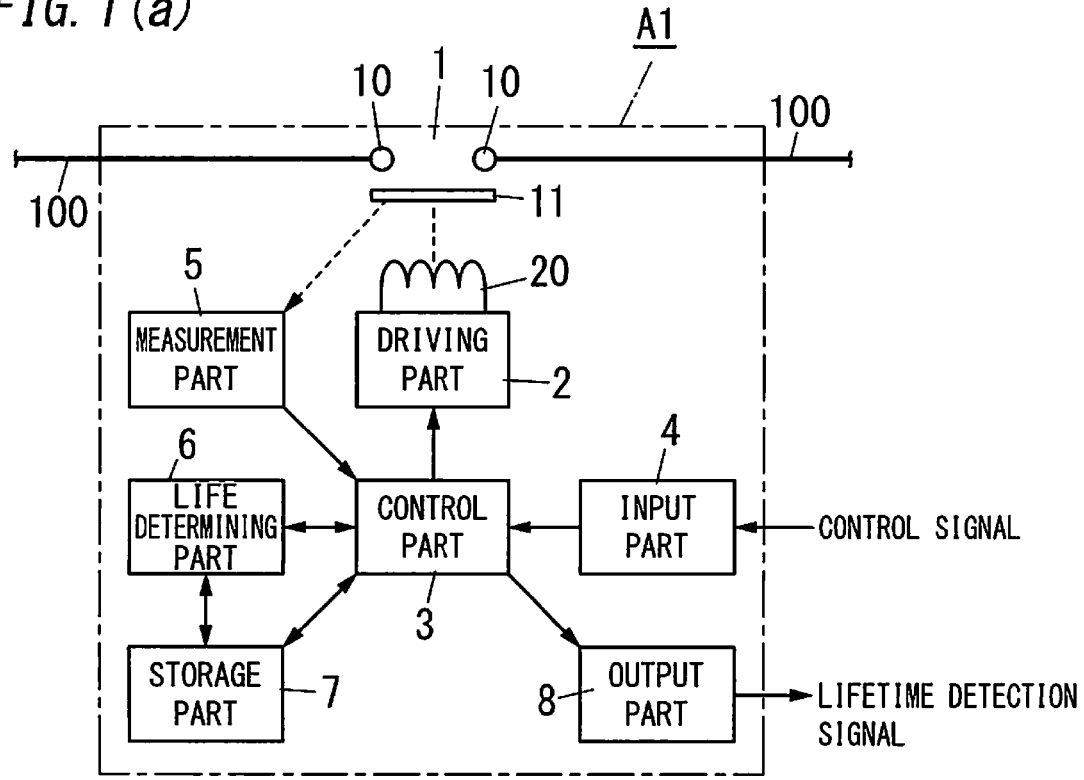
FIGS. 1(a) and 1(b) are block diagrams illustrating a configuration according to First Embodiment of the present invention.

As shown in FIG. 1(a), an electromagnetic opening/closing device A1 according to the present embodiment includes a contact part 1, a driving part 2, a control part 3, an input part 4, a measurement part 5, a life determining part 6, a storage part 7, an output part 8 and the like. The contact part 1 has two fixed contacts 10 that are inserted in a portion of an electric path 100, and a movable contact (mover) 11 that comes into contact with or separates from the two fixed contacts 10. That is, while the movable contact 11 is in contact with the two fixed contacts 10, the contact part 1 is closed and the electric path 100 is in a conducting state. On the other hand, while the movable contact 11 is out of contact with the two fixed contacts 10, the contact part 1 is opened and the electric path 100 is in a non-conducting state.

Figure 2A:
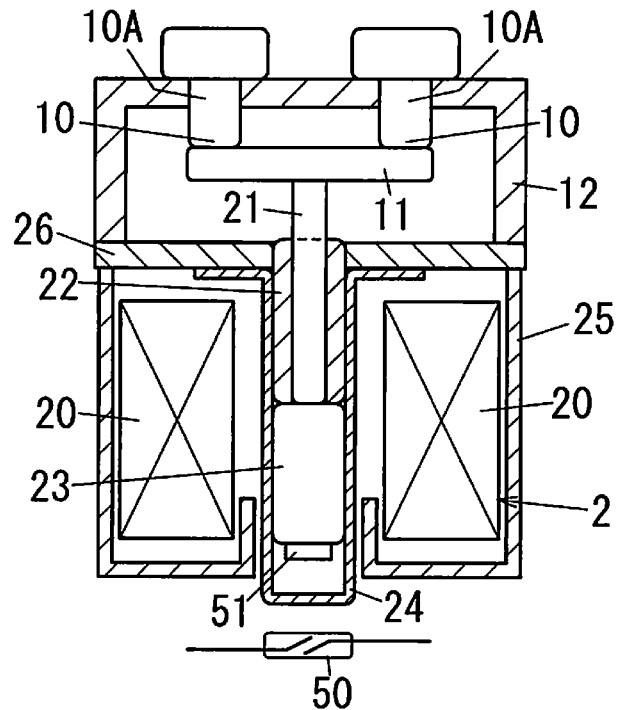
FIGS. 2(a) and 2(b) are cross-section diagrams illustrating the configuration of which a part is omitted according to the First Embodiment of the present invention.

FIG. 2(a) is a cross-section diagram illustrating the electromagnetic opening/closing device A1 (of which a part is omitted) according to the present embodiment. An up-down direction and a right-left direction in the following explanations are defined based on view of FIG. 2(a).

The respective fixed contacts 10 are located at tips (lower ends) of fixed terminals 10A formed cylindrically. The movable contact 11 is made of copper or copper alloy and is formed into a rectangle plate, and a central part of the movable contact 11 in a longitudinal direction (a right-left direction) is held by a movable shaft 21. The fixed contacts 10 and the movable contact 11 are housed in a ceramic-made sealed container 12 that is formed into a box-shape, a lower surface of which is opened. The pair of fixed terminals 10A passes through the base wall of the sealed container 12.

The driving part 2 includes an excitation coil 20, the movable shaft 21, a fixed iron-core 22, a movable iron-core 23, a cap 24, yokes 25 and 26, and the like. The cap 24 is made of non-magnetic materials, and is formed into a cylindrical shape with a bottom. The movable iron-core 23 is located at the internal bottom (lower) side of the cap 24 to be housed in the cap 24, and further the fixed iron-core 22 is fixed at the opening (upper) side of the cap 24 to be housed in the cap 24. The movable shaft 21 movably passes through the fixed iron-core 22, and further the lower edge of the movable shaft 21 is fixed at the movable iron-core 23. Although not shown in Figures, the driving part further includes a return spring, which and is located between the fixed iron-core 22 and the movable iron-core 23 and elastically energizes the movable iron-core 23 in a direction separated from the fixed iron-core 22 (downward direction). Further, the driving part 2 includes a contact pressure spring (not shown), which is located between the fixed iron-core 22 and the movable contact 11 and elastically energizes the movable contact 11 in a direction approaching the fixed contacts 10 (upward direction). Further, the driving part includes a coil bobbin (not shown), which is made of insulating materials and is located outside the cap 24. The excitation coil 20 is located so as to be wound on the coil bobbin. The yokes 25 and 26 are located outside the excitation coil 20. Thus, the excitation coil 20 and the yokes 25 and 26 form a magnetic circuit. The yoke 26 is formed into a flat plate, and is located between the excitation coil 20 and the sealed container 12.

Thus, while no excitation current flows to the excitation coil 20, the movable iron-core 23, elastically energized by the return spring, is displaced (moved) downward, and therefore the movable shaft 21 and the movable contact 11 are also displaced downward. As a result, the movable contact 11 is separated from the two fixed contacts 10, and the contact part 1 is opened. On the other hand, when the excitation current flows to the excitation coil 20, the movable iron-core 23 is displaced in the direction approaching the fixed iron-core 22 (upward direction) by an electromagnetic force which acts between the fixed iron-core 22 and the movable iron-core 23, and therefore the movable shaft 21 and the movable contact 11 are also displaced upward. As a result, the movable contact 11 comes into contact with the two fixed contacts 10, and the contact part 1 is closed. That is, the excitation coil 20 and the fixed iron-core 22 constitute an electromagnet, and the movable iron-core 23 is displaced due to the electromagnetic force that is generated by this electromagnet.

The control part 3 controls the driving part 2 in response to a control signal inputted from outside to the input part 4. That is, when the control signal for turning contact ON is inputted into the input part 4, the control part 3 makes the excitation current flow to the excitation coil 20 of the driving part 2 in order to close the contact part 1. On the other hand, when the control signal for turning contact OFF is inputted into the input part 4, the control part 3 stops the excitation current flowing to the excitation coil 20 in order to open the contact part 1. The control signal is a DC voltage signal of which level is switched to High or Low. The High level corresponds to the output level of the control signal for turning contact ON, and the Low level corresponds to the output level of the control signal for turning contact OFF.

The measurement part 5 measures, as a change associated with the opening/closing of the contact, the number of times the contact part 1 has been opened or closed. The measurement part measures the number of times the contact part 1 has been opened or closed, based on the number of times an auxiliary contact 50 has been opened or closed. In this case, the number of times the contact part 1 has been opened or closed is stored in the storage part 7. The number of times stored in the storage part 7 is counted up by the measurement part 5 whenever the contact part 1 is opened and closed.

Figure 2B:
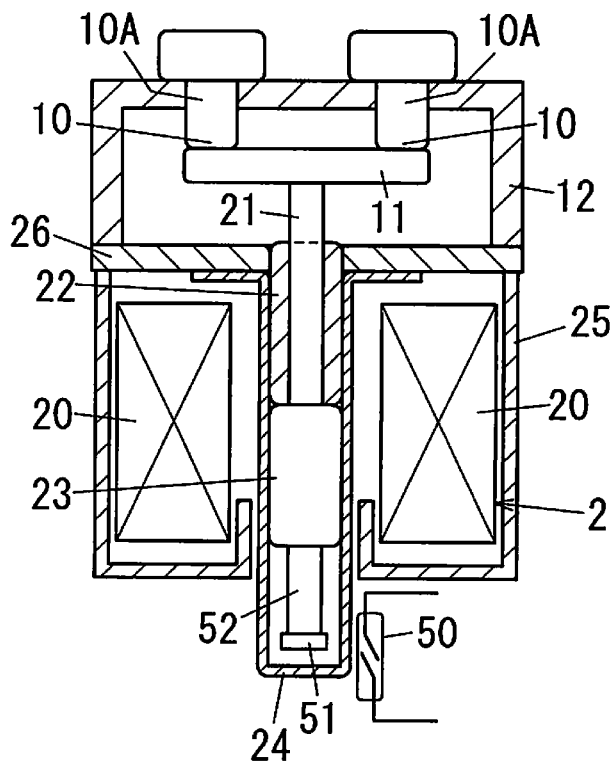

As shown in FIG. 2(a), the auxiliary contact 50 includes a reed switch that is located below the cap 24, and is turned on due to a magnetic force generated by a permanent magnet 51 attached on a lower surface of the movable iron-core 23. That is, while the contact part 1 is opened, the movable iron-core 23 is positioned at the bottom (lower) side of the cap 24, and therefore the reed switch (auxiliary contact 50) is turned on due to the magnetic force generated by the permanent magnet 51. However while the contact part 1 is closed, the movable iron-core 23 is positioned at the opening (upper) side of the cap 24, and therefore the reed switch (auxiliary contact 50) is hardly influenced by the magnetic force generated by the permanent magnet 51, and is turned off. Here, as shown in FIG. 2(b), the auxiliary contact 50 may be located at a lateral side of the cap 24. In this case, the permanent magnet 51 is attached at a tip (lower end) of a supporting member 52 that is provided on the bottom face of the movable iron-core 23.

The life determining part 6 compares the number of times stored in the storage part 7 with a predetermined threshold value similarly stored in the storage part 7, and determines that the device does not reach end of life, while the number of times the contact part 1 has been opened or closed is less than the threshold value. On the other hand, when the number of times the contact part 1 has been opened or closed is equal to or more than the threshold value, the life determining part 6 determines that the device has reached the end of life. Then, the determined result by the life determining part 6 is outputted to the control part 3. If the determined result by the life determining part 6 indicates that the device does not reach the end of life, the control part 3 allows the output part 8 to output a lifetime detection signal with output of Low level. If the determined result indicates that the device has reached the end of life, the control part 3 allows the output part 8 to output the lifetime detection signal with output of High level. Here, preferably, the threshold value, with which the number of times the contact part 1 has been opened or closed is compared, is set equal to the number of times or slightly less in which the operation of the electromagnetic opening/closing device A1 is guaranteed. Here, the control part 3, input part 4, life determining part 6, storage part 7 and output part 8 may be achieved by separate hardware (circuits), or may be achieved by a single microcomputer and various software.

As described above, the electromagnetic opening/closing device A1 according to the present embodiment includes: the measurement part 5 that measures a change (the number of times of the contact part 1 has been opened or closed) associated with the opening/closing of the contact; the life determining part 6 that determines a state of the contact, based on the change (the number of times the contact part 1 has been opened or closed) measured by the measurement part 5; and the output part 8 that outputs the determined result by the life determining part 6 to outside. That is, differently from the conventional technique, an apparatus, equipped with the electromagnetic opening/closing device A1 according to the present embodiment, has no need to count the number of times the contact part has been opened or closed in order to manage the lifetime of the device A1. Therefore, it is possible to easily manage the lifetime compared with conventional devices.

Figure 1B:
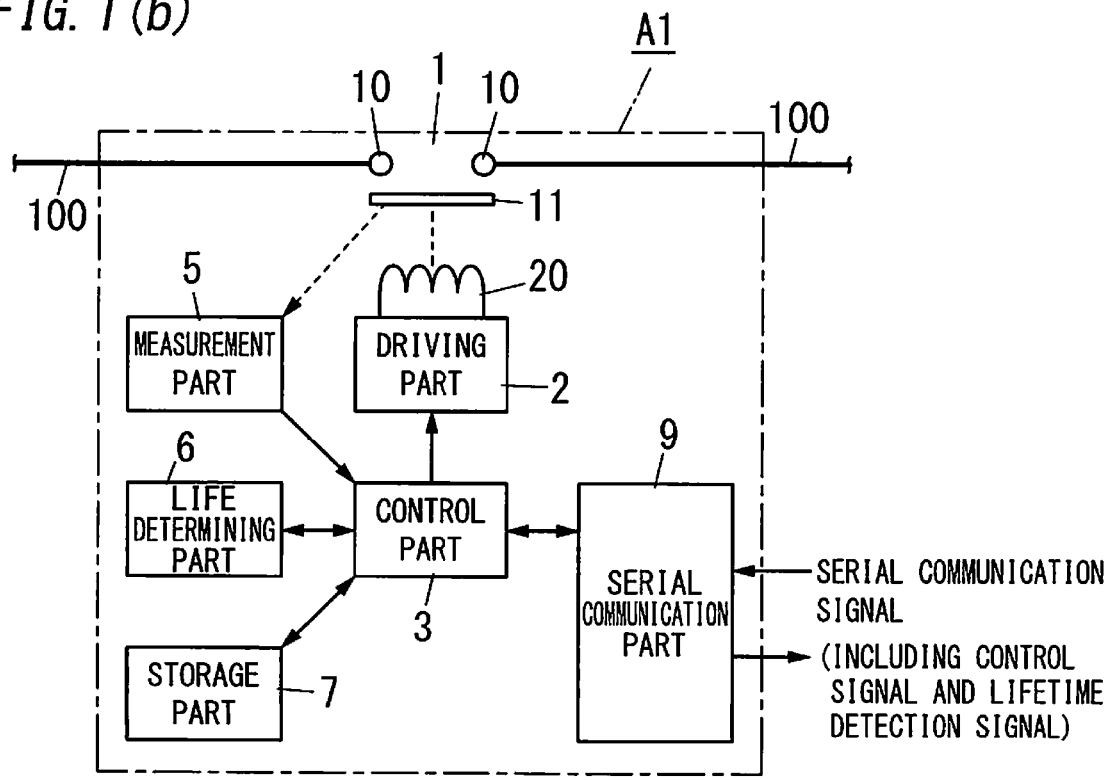

Here, instead of the input part 4 and the output part 8, as shown in FIG. 1(b), the electromagnetic opening/closing device A1 may be provided with a serial communication part 9 that interfaces communication between the control part 3 and the outside. In this case, if accessing the control part 3 through the serial communication part 9, the outside also can make the control part 3 extract and transmit the number of times the contact part has been opened or closed, stored in the storage part 7.

Figure 3A:
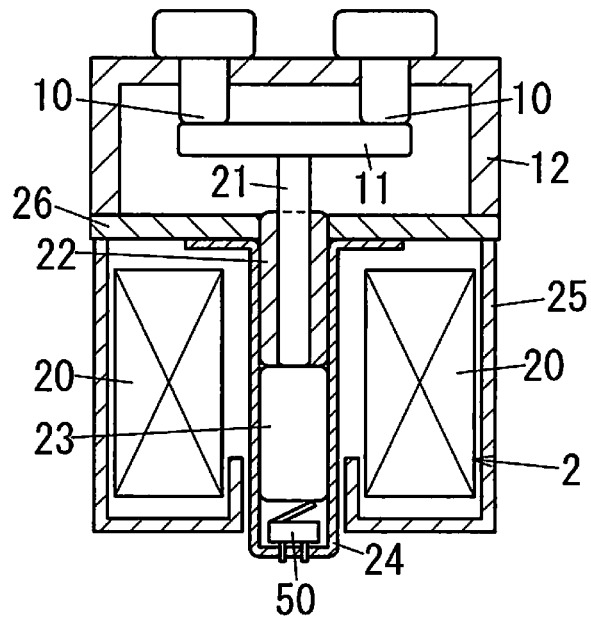
FIGS. 3(a) to 3(c) are cross-section diagrams illustrating another configuration of which a part is omitted according to the First Embodiment of the present invention.
Figure 3B:
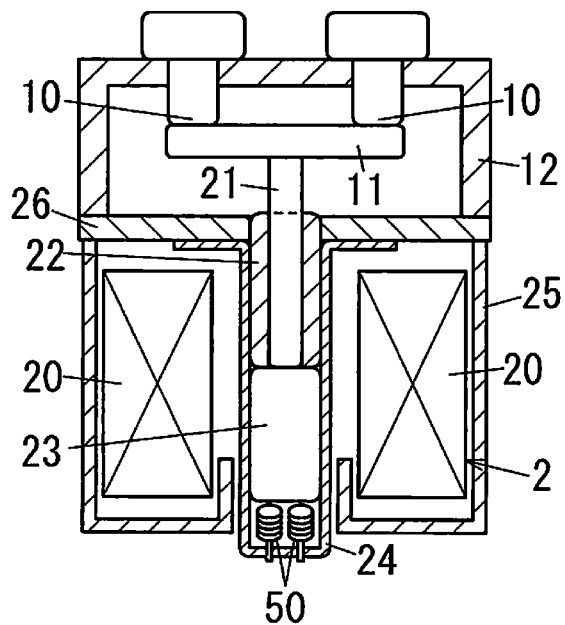
Figure 3C:
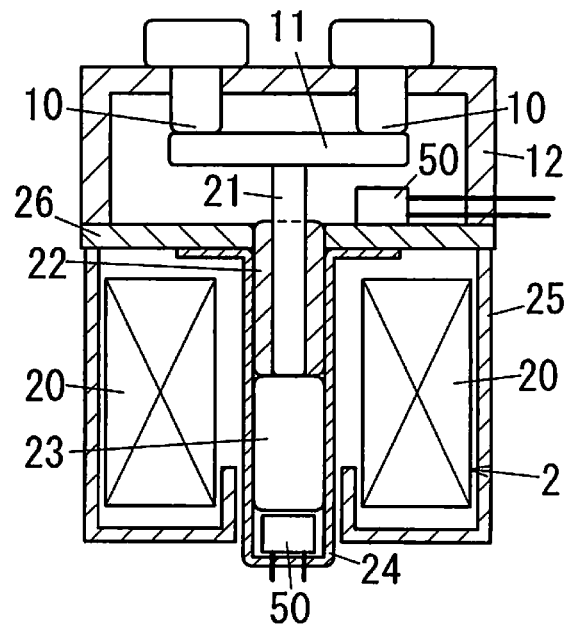

The auxiliary contact 50 is not limited to the reed switch. For example, as shown in FIG. 3(a), the auxiliary contact 50 may be a micro switch that is located at the inside bottom of the cap 24. In this case, while the contact part 1 is opened, the movable iron-core 23 turns on the micro switch (auxiliary contact 50). While the contact part 1 is closed, the movable iron-core 23 turns off the micro switch (auxiliary contact 50). Or, as shown in FIG. 3(b), the auxiliary contact 50 may be a pair of spring contacts that are arranged at the inside bottom of the cap 24. In this case, while the contact part 1 is opened, the movable iron-core 23 turns on the pair of spring contacts (auxiliary contact 50). While the contact part 1 is closed, the movable iron-core 23 turns off the pair of spring contacts (auxiliary contact 50). Or, as shown in FIG. 3(c), the auxiliary contact 50 may be a pair of contacts. One of the pair of contacts is located at the inside bottom of the cap 24 and the other is located on the upper surface of the yoke 26. In this case, while the contact part 1 is opened, a closed circuit is formed between the pair of contacts, through the yoke 26, the fixed iron-core 22 and the movable iron-core 23, and therefore the auxiliary contact 50 is turned on. On the other hand, while the contact part 1 is closed, the closed circuit is not formed, and therefore the auxiliary contact 50 is turned off.

As explained above, the electromagnetic opening/closing device A1 shown in FIG. 1 operates in response to a command from outside. The electromagnetic opening/closing device A1 includes a contact, a measurement means, a determining means and an output means. The contact is configured to open or close in response to the command from the outside.

The measurement means is configured to recognize a change associated with the opening/closing of the contact. More specifically, the measurement means measures the number of times the contact has been opened or closed, and recognizes the change associated with the opening/closing of the contact, based on the number of times the contact has been opened or closed.

The determining means is configured to determine a state of the contact, based on the change recognized by the measurement means. The output means is configured to output the determined result by the determining means to outside.

In this configuration, it is possible to easily manage the lifetime of the electromagnetic opening/closing device A1.

Further, the electromagnetic opening/closing device A1 includes a driving means. The driving means is configured to open or close the contact.

When current is supplied to the driving means, the driving means is configured to open or close the contact.

Further, the electromagnetic opening/closing device A1 includes a control means. The control means is configured to control the driving means in response to the command from the outside.

Further, the control means controls the current supplied to the driving means in response to the command.

Further, the measurement means is configured to measure the number of times the contact has been opened or closed.

Further, the determining means determines the state of the contact, based on a change in the number of times the contact has been opened or closed, measured by the measurement means.

Further, the electromagnetic opening/closing device A1 includes a storage means. The storage means is configured to store the total of the number of times the contact has been opened or closed.

Further, the storage means stores a threshold value.

Further, the measurement means is configured to compare "the total of the number of times the contact has been opened or closed" with "the threshold value". The comparison result, obtained by comparing "the total of the number of times the contact has been opened or closed" with "the threshold value", is defined as the determined result. The output means outputs the determined result to outside.

As shown in FIG. 2(a), the electromagnetic opening/closing device A1 further includes an auxiliary contact 50. The auxiliary contact 50 is configured to interlock with the opening/closing of the contact. The measurement means measures the number of times the contact has been opened or closed, based on the number of times the auxiliary contact 50 has been opened or closed.

Further, the electromagnetic opening/closing device A1 includes a fixed iron-core 22 and a movable iron-core 23. The movable iron-core 23 is located so as to be separated from the fixed iron-core 22. The contact includes a fixed contact 10 and a movable contact 11. The movable contact 11 is configured to interlock with the movable iron-core 23.

When the movable iron-core 23 is moved toward the fixed iron-core 22, the movable contact 11 is moved toward the fixed contact 10. When the movable iron-core 23 is moved so as to be separated from the fixed iron-core 22, the movable contact 11 is moved so as to be separated from the fixed contact 10. The auxiliary contact 50 is configured to open or close with the movement of the movable iron-core 23.

As shown in FIG. 2(a), the movable iron-core 23 has a permanent magnet 51. The electromagnetic opening/closing device A1 includes the auxiliary contact 50. The permanent magnet 51 is configured to be movable between a first position and a second position. When the permanent magnet 51 is located at the first position, the auxiliary contact 50 is configured to be turned on by a magnetic field of the permanent magnet 51. When the permanent magnet 51 is located at the second position, the auxiliary contact 50 is configured to be turned off. The permanent magnet 51 is configured to be moved between the first position and the second position with the movement of the movable iron-core 23.

As shown in FIG. 2(b), the movable iron-core 23 has a supporting member 52. The supporting member 52 supports the permanent magnet 51. The electromagnetic opening/closing device A1 includes the auxiliary contact 50. The permanent magnet 51 is configured to be movable between a first position and a second position. When the permanent magnet 51 is located at the first position, the auxiliary contact 50 is configured to be turned on by a magnetic field of the permanent magnet 51. When the permanent magnet 51 is located at the second position, the auxiliary contact 50 is configured to be turned off. The permanent magnet 51 is configured to be moved between the first position and the second position with the movement of the movable iron-core 23.

The electromagnetic opening/closing device A1 is not limited to the configurations shown in FIG. 2(a) and FIG. 2(b).

That is, the electromagnetic opening/closing device A1 can also have other configuration, as long as the device A1 has the auxiliary contact 50 and the permanent magnet 51. In this case, the permanent magnet 51 is configured to be movable between a first position and a second position. The permanent magnet 51 is configured to be moved between the first position and the second position with the movement of the movable iron-core 23. When the permanent magnet 51 is located at the first position, the auxiliary contact 50 is configured to be turned on by a magnetic field of the permanent magnet 51. When the permanent magnet 51 is located at the second position, the auxiliary contact 50 is configured to be turned off.

In the configurations shown in FIGS. 2(a) and 2(b), when the permanent magnet 51 is located at the first position, the auxiliary contact 50 is configured to be turned on by the magnetic field of the permanent magnet 51. When the permanent magnet 51 is located at the second position, the auxiliary contact 50 is configured to be turned off. However, when the permanent magnet 51 is located at the first position, the auxiliary contact 50 may be configured to be turned off. In this case, when the permanent magnet 51 is located at the second position, the auxiliary contact 50 is configured to be turned on by the magnetic field of the permanent magnet 51.

That is, the electromagnetic opening/closing device A1 can also have other configuration, as long as the device A1 has the auxiliary contact 50 and the permanent magnet 51. In this case, the permanent magnet 51 is configured to be movable between a first position and a second position. The permanent magnet 51 is configured to be moved between the first position and the second position with the movement of the movable iron-core 23. The auxiliary contact 50 is configured to open or close by the movement of the permanent magnet 51 between the first position and the second position.

As shown in FIGS. 3(a), 3(b) and 3(c), the electromagnetic opening/closing device A1 includes a cap, the movable iron-core 23 and the fixed iron-core 22. The cap has a longitudinal direction. The movable iron-core 23 and the fixed iron-core 22 are located inside the cap along the longitudinal direction of the cap. The movable iron-core 23 is located inside the cap so as to be movable between a first position and a second position.

As shown in FIGS. 3(a), 3(b) and 3(c), the electromagnetic opening/closing device A1 includes the auxiliary contact 50. The auxiliary contact 50 is located so as to be opposed to the fixed iron-core 22 through the movable iron-core 23. The movable iron-core 23 is configured to be movable between the first position and the second position. When the movable iron-core 23 is located at the first position, the movable iron-core 23 has contact with the auxiliary contact 50, and therefore the auxiliary contact 50 is turned on. When the movable iron-core 23 is located at the second position, the movable iron-core 23 separates from the auxiliary contact 50, and therefore the auxiliary contact 50 is turned off.

Here, as shown in FIGS. 3(a), 3(b) and 3(c), when the movable iron-core 23 is located at the first position, the movable iron-core 23 has contact with the auxiliary contact 50, and therefore the auxiliary contact 50 is closed. However, when the movable iron-core 23 is located at the first position, the auxiliary contact 50 may be opened.

That is, the electromagnetic opening/closing device A1 includes the auxiliary contact 50. The auxiliary contact 50 is located so as to be opposed to the fixed iron-core 22 through the movable iron-core 23. The movable iron-core 23 is configured to be movable between the first position and the second position. The auxiliary contact 50 is configured to open or close by the movement of the movable iron-core 23 between the first position and the second position.

Second Embodiment

Figure 4:
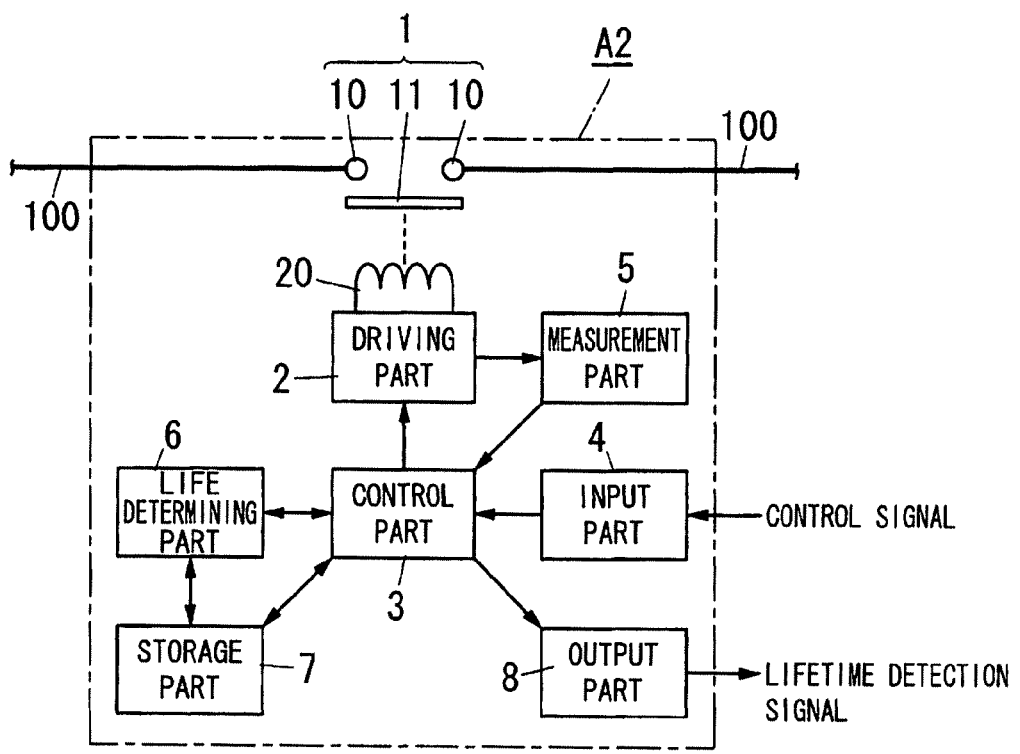
FIG. 4 is a block diagram illustrating a configuration according to Second Embodiment of the present invention.

As shown in FIG. 4, the basic configuration of an electromagnetic opening/closing device A2 according to the present embodiment is similar to that of the device according to the First Embodiment. Therefore, such basic configuration elements are assigned with same reference numerals, and explanations thereof will be omitted appropriately.

The present embodiment is characterized in that the measurement part 5 measures the number of times the contact part 1 has been opened or closed, based on the number of times the control signal has been inputted into the input part 4. That is, when the control signal for turning contact ON or the control signal for turning contact OFF is inputted into the input part 4, the control part 3 controls on/off of the excitation current supplied to the driving part 2. Therefore, the measurement part 5 can measure the number of times the contact part 1 has been opened or closed through detecting the excitation current.

Thus, in the electromagnetic opening/closing device A2 according to the present embodiment, the measurement part 5 can measure the number of times the contact part 1 has been opened or closed without the auxiliary contact 50, and therefore it is possible to simplify the configuration, to downsize the device and to reduce the cost, compared with the First Embodiment with the auxiliary contact 50.

Summarizing the above, the measurement means is configured to measure the number of times the contact has been opened or closed, based on the number of times the command has been inputted.

The electromagnetic opening/closing device A2 includes an input means. The input means is configured to receive the command from the outside. The measurement means is configured to measure the number of times the contact has been opened or closed, based on the number of times the command has been inputted from the outside to the input means.

Third Embodiment

The basic configuration of an electromagnetic opening/closing device A3 according to the present embodiment is similar to that of the device according to the First Embodiment. Therefore, such basic configuration elements are assigned with same reference numerals, and diagrams and explanations thereof will be omitted appropriately.

Figure 5A:
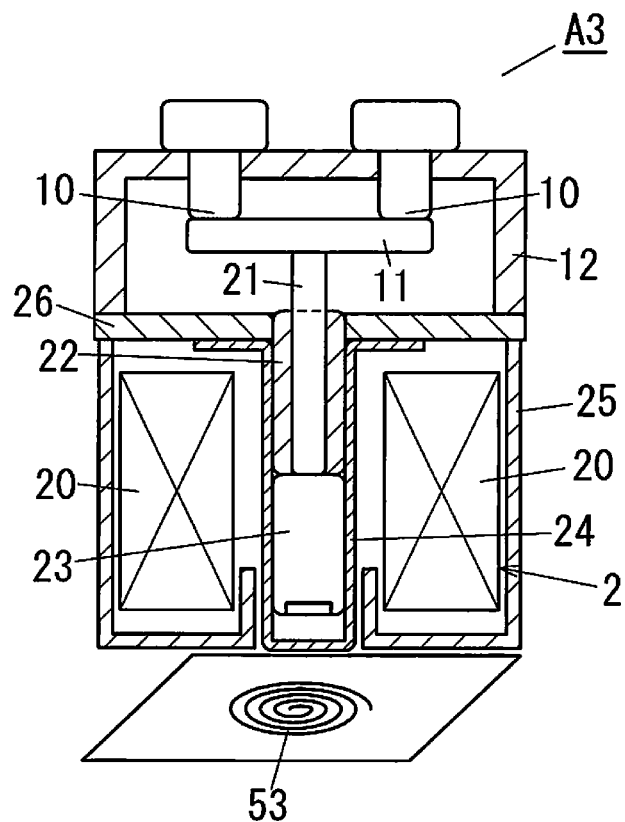
FIGS. 5(a) and 5(b) are cross-section diagrams illustrating a configuration of which a part is omitted according to Third Embodiment of the present invention.
Figure 5B:
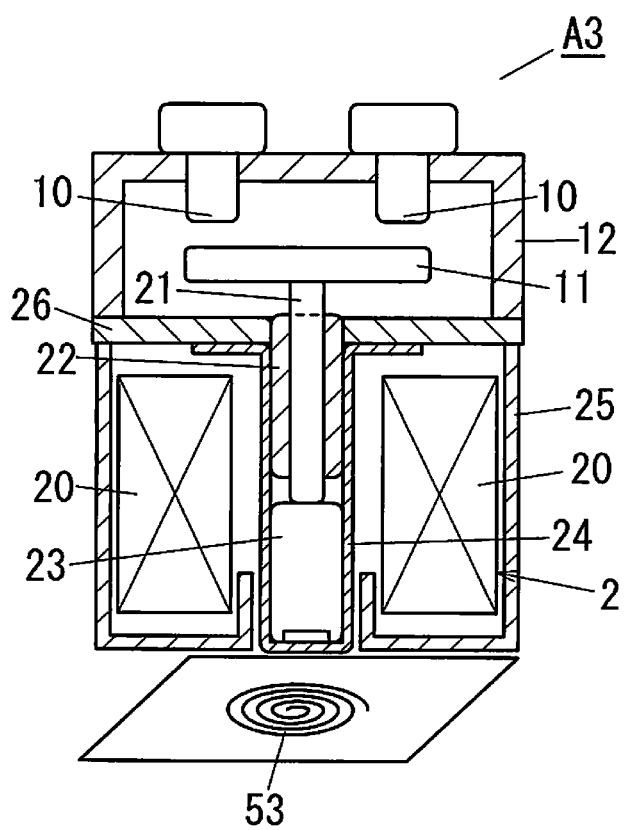

As shown in FIGS. 5(*a*) and 5(*b*), the measurement part 5 according to the present embodiment is provided with a detection coil 53 that is located at a position opposed to the lower end of the cap 24. The measurement part measures the number of times the contact part 1 has been opened or closed, by utilizing a change in the characteristic of an electric circuit including the detection coil 53 depending on a distance between the movable iron-core 23 and the detection coil.

The measurement part 5 has for example an LC oscillation circuit that is constituted by a parallel circuit of the detection coil 53 and a capacitor (not shown). When the movable iron-core 23 made of metal approaches the detection coil 53 that constitutes the LC oscillation circuit, an eddy current loss is generated by the electromagnetic induction effect, and then an effective resistance value (conductance) of the detection coil 53 is changed. When the conductance of the detection coil 53 is changed, the oscillation condition of the LC oscillation circuit is also changed, and therefore the LC oscillation circuit is changed from an oscillating state to a stopping state of the oscillation or to a state where the oscillation amplitude is attenuated by a predetermined value or more. Accordingly, the measurement part 5 determines that the movable iron-core 23 approaches the detection coil 53, namely the contact part 1 is opened, based on a change in the oscillation of the LC oscillation circuit from the oscillating state to the stopping state or to the state where the oscillation amplitude is attenuated by the predetermined value or more (see FIG. 5(*b*)). On the other hand, when the LC oscillation circuit starts oscillating or the oscillation amplitude is increased by a predetermined value or more, the measurement part 5 determines that the movable iron-core 23 does not approach the detection coil 53, namely the contact part 1 is closed (see FIG. 5(*a*)). In other words, the measurement part 5 can measure the number of times the contact part 1 has been opened or closed, based on the characteristic (the presence or absence of the oscillation, or the magnitude of the oscillation amplitude) of the electric circuit (LC oscillation circuit) including the detection coil 53.

Figure 6:
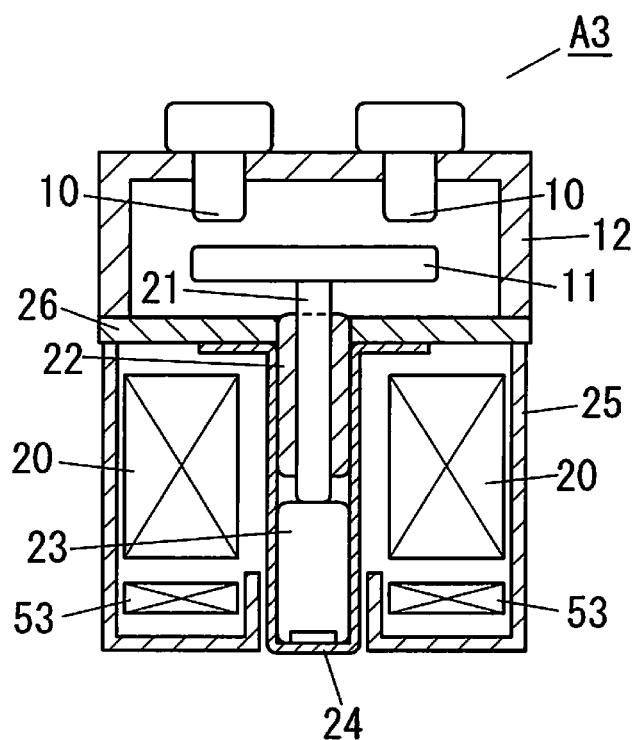
FIG. 6 is a cross-section diagram illustrating another configuration of which a part is omitted according to the Third Embodiment of the present invention.

Here, as shown in FIG. 6, the detection coil 53 may be located not below the movable iron-core 23 but at a lateral side of the movable iron-core 23 (below the excitation coil 20). Or, the excitation coil 20 may double as the detection coil, through superimposing a high-frequency electric current on the excitation current flowing to the excitation coil 20.

Here, in the detection method described above, there is a need to constantly flow the high-frequency electric current to the detection col 53 of the measurement part 5. Therefore, power consumed by the measurement part 5 is increased. Accordingly, in order to prevent the increase in the consumed power, it is preferred that the following detection method be adopted.

This detection method utilizes an effect that the conductance of the detection coil 53 is proportional to a time constant of the LC oscillation circuit and the time constant is increased with an increase in the conductance. For example, when a constant voltage is applied across the detection coil 53, a rise time of a voltage V across the detection coil 53 is increased, as the time constant is large.

Figure 7:
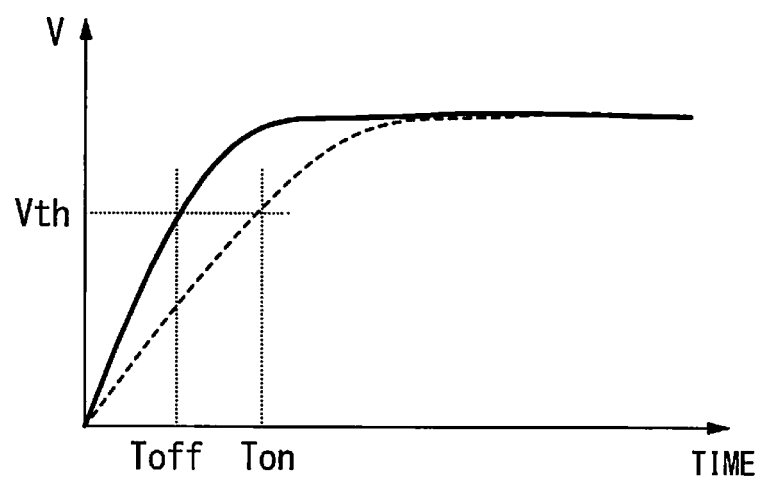
FIG. 7 is a diagram for explaining operation of a measurement part in the another configuration according to the Third Embodiment of the present invention.

Therefore, the measurement part 5 measures rise times Ton and Toff until the voltage V across the detection coil 53 exceeds a predetermined reference value Vth while applying a pulse voltage to the detection coil 53 periodically, and thereby it is possible to determine the opening and closing of the contact part 1 and to measure the number of times the contact part 1 has been opened or closed (see FIG. 7). In such a detection method, because the number of times the contact part has been opened or closed can be measured by applying the periodical pulse voltage (or step voltage) across the detection coil 53, it is possible to prevent an increase in the power consumed by the measurement part 5, compared with the case where the high-frequency electric current constantly flows to the detection col 53.

Summarizing the above, as shown in FIG. 5(*a*) and FIG. 5(*b*), the electromagnetic opening/closing device A3 includes the movable iron-core 23. The measurement means has the detection coil 53. The movable iron-core 23 is configured to be movable between a first position and a second position. When affected by the magnetic field, the movable iron-core 23 is moved between the first and second positions along a moving direction connecting the first and second positions. The detection coil 53 and the movable iron-core 23 are located in the moving direction.

As shown in FIG. 6, the electromagnetic opening/closing device A3 includes the excitation coil and the movable iron-core 23. The measurement means has the detection coil 53. The contact has the movable contact 11. The excitation coil is configured to generate the magnetic field when affected by current. The movable contact 11 is configured to interlock with the movable iron-core 23. When affected by the magnetic field, the movable iron-core 23 is configured to be moved. The contact is opened or closed through the movement of the movable iron-core 23. The detection coil 53 is located at a lateral side of the excitation coil.

Fourth Embodiment

The basic configuration of an electromagnetic opening/closing device A4 according to the present embodiment is similar to that of the device according to the First Embodiment. Therefore, such basic configuration elements are assigned with same reference numerals, and diagrams and explanations thereof will be omitted appropriately.

Figure 8:
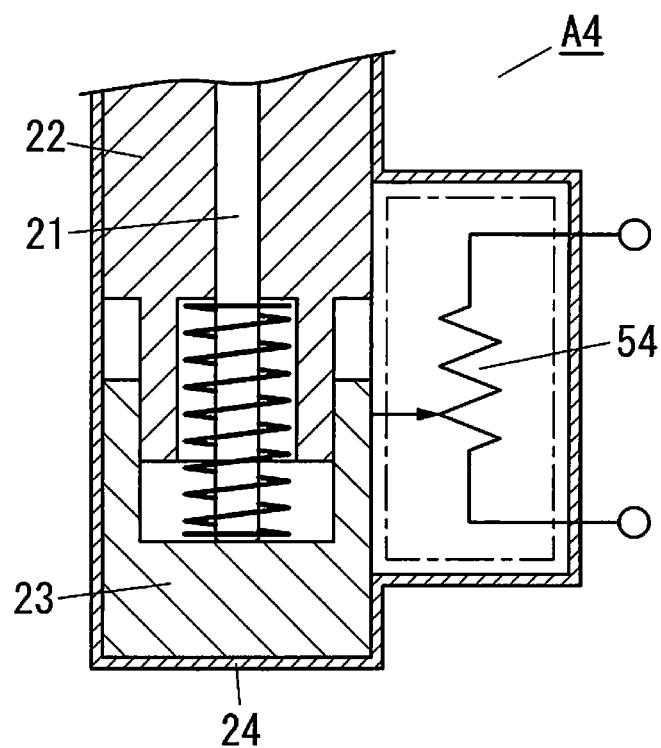
FIG. 8 is a cross-section diagram illustrating a main section of a configuration according to Fourth Embodiment of the present invention.

FIG. 8 discloses the electromagnetic opening/closing device A4 according to the Fourth Embodiment.

The measurement part 5 according to the present embodiment has a slide type variable resistor 54 that is housed inside the cap 24. A sliding knob (not shown) of the variable resistor 54 is configured to be displaced by interlocking with the movable iron-core 23. That is, a resistance value of the variable resistor 54 changes in response to a displacement of the movable iron-core 23 (a displacement of the movable contact 11). Therefore, the measurement part 5 can measure the number of times the contact part 1 has been opened or closed, through detecting the opening and closing of the contact part 1 based on the change in the resistance value. For example, the measurement part 5 applies a certain direct current to the variable resistor 54 and detects a voltage across the variable resistor 54, in order to detect the change in the resistance value. Or, the measurement part 5 applies a certain direct voltage to a series circuit of the variable resistor 54 and a fixed resistor and detects an electric potential at a connection point of both, in order to detect the change in the resistance value.

In the present embodiment, because the number of times the contact part has been opened or closed can be measured by applying slightly the direct current or the direct voltage to the variable resistor 54 (or the series circuit of the variable resistor 54 and the fixed resistor), it is possible to prevent an increase in the power consumed by the measurement part 5, compared with the Third Embodiment in which the high-frequency electric current flows to the detection col 53.

Figure 9A:
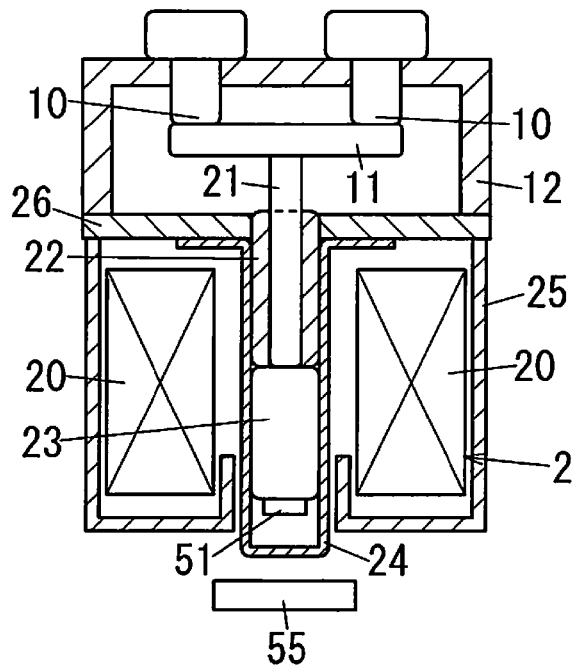
FIGS. 9(a) to 9(c) are cross-section diagrams illustrating another configuration of which a part is omitted according to the Fourth Embodiment of the present invention.
Figure 9B:
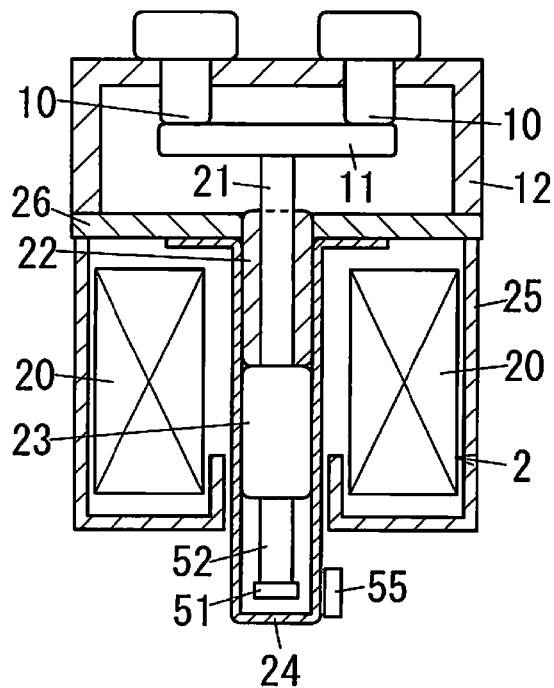
Figure 9C:
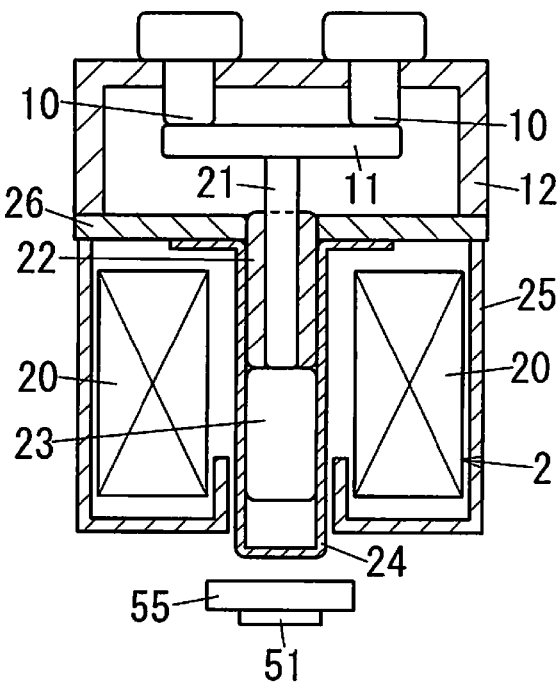

Here, it is also possible to detect the displacement of the movable iron-core 23 with a magnetic sensor 55 in which a hall element is utilized, instead of the variable resistor 54. For example, as shown in FIG. 9(a), the magnetic sensor 55, which is located below the cap 24, detects the position of the permanent magnet 51 attached on a lower surface of the movable iron-core 23. Or, as shown in FIG. 9(b), the magnetic sensor 55 may be located on a side surface of the cap 24. In this case, the permanent magnet 51 is attached at the tip (lower end) of the supporting member 52 that is provided on the bottom face of the movable iron-core 23. Or, as shown in FIG. 9(c), while the magnetic sensor 55 is located below the cap 24, the permanent magnet 51 may be attached on a bottom face of the magnetic sensor 55.

As above, the contact of the electromagnetic opening/closing device A4 shown in FIG. 8 has the fixed contact 10 and the movable contact 11. The electromagnetic opening/closing device A4 further includes the displacement means that is configured to displace the movable contact 11. The measurement means is configured to measure the number of times the contact has been opened or closed, based on the displacement of the movable contact 11 by the displacement means.

When explained from other aspect, the contact has the fixed contact 10 and the movable contact 11. The electromagnetic opening/closing device A4 includes the movable iron-core 23. The measurement means has the variable resistor. The movable iron-core 23 is configured to be movable between a first position and a second position. When affected by the magnetic field, the movable iron-core 23 is configured to be moved between the first and second positions, and therefore the contact is opened or closed. The resistance value of the variable resistor changes in response to a change in the position of the movable iron-core 23. The measurement means is configured to measure the number of times the contact has been opened or closed, based on a change in the resistance value of the variable resistor.

Fifth Embodiment

The basic configuration of an electromagnetic opening/closing device A5 according to the present embodiment is similar to that of the device according to the First Embodiment. Therefore, such basic configuration elements are assigned with same reference numerals, and diagrams and explanations thereof will be omitted appropriately.

The measurement part 5 according to the present embodiment detects a strain caused by an external force applied for the displacement of the movable contact 11, and measures the number of times the contact has been opened or closed, through detecting the displacement of the movable contact 11, namely the opening and closing of the contact part 1, based on the magnitude of the strain.

For example, the movable contact 11 receives a spring force generated by a contact pressure spring. In this case, the spring force changes when the contact part 1 is opened and closed. Therefore, the measurement part 5 can detect the opening and closing of the contact part 1, based on a detection output of a strain gauge (strain sensor) attached at the movable contact 11. Here, the position where the strain gauge is attached is not limited to the movable contact 11. The strain gauge may be attached at the sealed container 12 or the other part. In particular, the strain gauge is preferably attached at a part in which the relatively-large strain is generated when the external force is applied to the part.

In the present embodiment, because power consumed by the strain gauge is very slight, it is possible to prevent an increase in power consumed by the measurement part 5, compared with the Third Embodiment in which the high-frequency electric current flows to the detection col 53.

Sixth Embodiment

The basic configuration of an electromagnetic opening/closing device A6 according to the present embodiment is similar to that of the device according to the First Embodiment. Therefore, such basic configuration elements are assigned with same reference numerals, and explanations thereof will be omitted appropriately.

Figure 10:
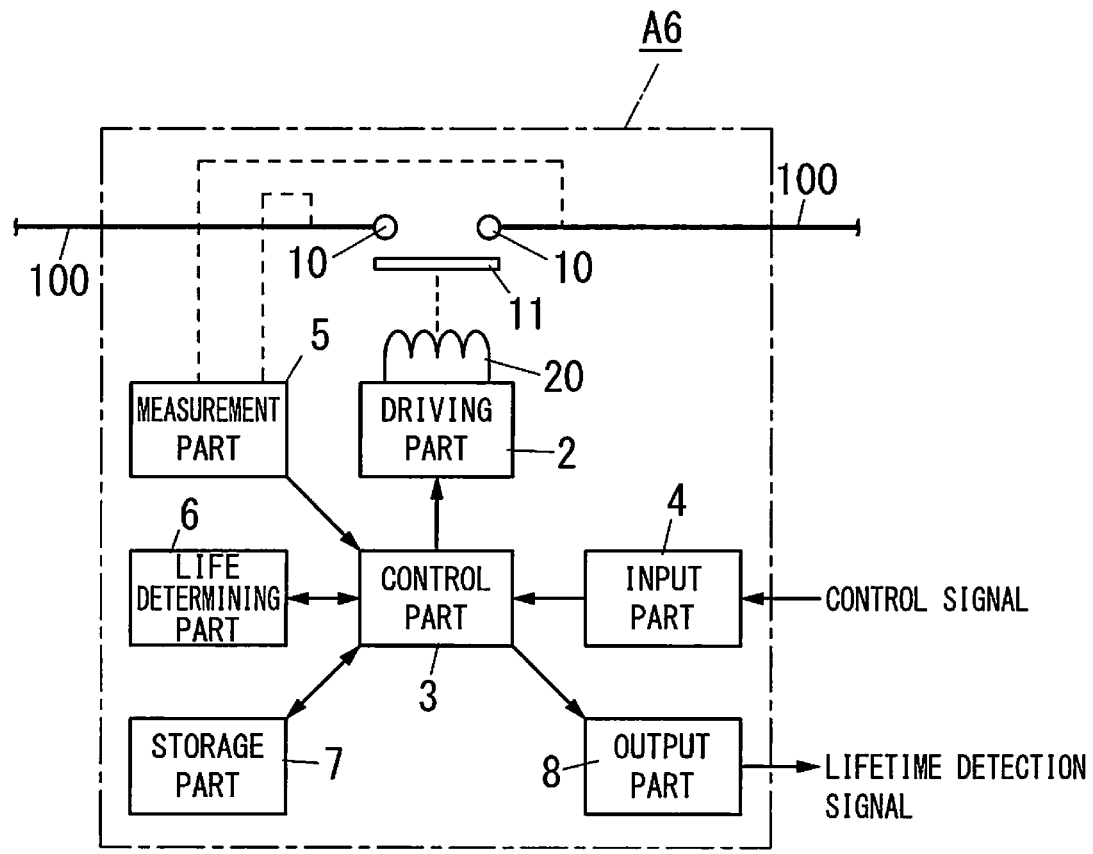
FIG. 10(a) is a block diagram illustrating a configuration according to Sixth Embodiment of the present invention.
FIG. 10(b) is a diagram for explaining operation of a measurement part in the configuration according to the Sixth Embodiment of the present invention.
Figure 10:
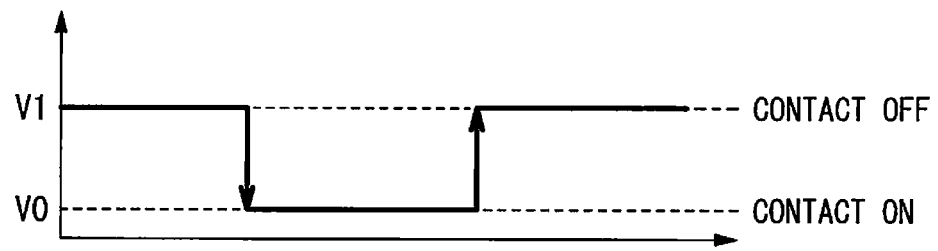

As shown in FIG. 10(a), the measurement part 5 according to the present embodiment measures the number of times the contact part 1 has been opened or closed, based on a voltage (hereinafter, called "a voltage between contacts") applied across the contact part 1. For example, the measurement part 5 has a resistor (not shown) connected between the pair of fixed contacts 10, and detects "the voltage between contacts" through a voltage drop generated at said resistor. That is, when the contact part 1 is opened, the absolute value of "the voltage between contacts" reaches a relatively-high voltage value V1. When the contact part 1 is closed, the absolute value of "the voltage between contacts" reaches a relatively-low voltage value V0 (a voltage value which is close to zero) (see FIG. 10(b)).

Therefore, when detecting that the absolute value of "the voltage between contacts" falls from the voltage value V1 to the voltage value V0, the measurement part 5 may count up, as one time, the number of times the contact part 1 has been opened or closed. Or, when detecting that the absolute value of "the voltage between contacts" rises from the voltage value V0 to the voltage value V1, the measurement part 5 may count up, as one time, the number of times the contact part 1 has been opened or closed.

In the present embodiment, because power consumed by the resistor for detecting "the voltage between contacts" is very slight, it is possible to prevent an increase in power consumed by the measurement part 5, compared with the Third Embodiment in which the high-frequency electric current flows to the detection col 53.

Seventh Embodiment

Figure 11A:
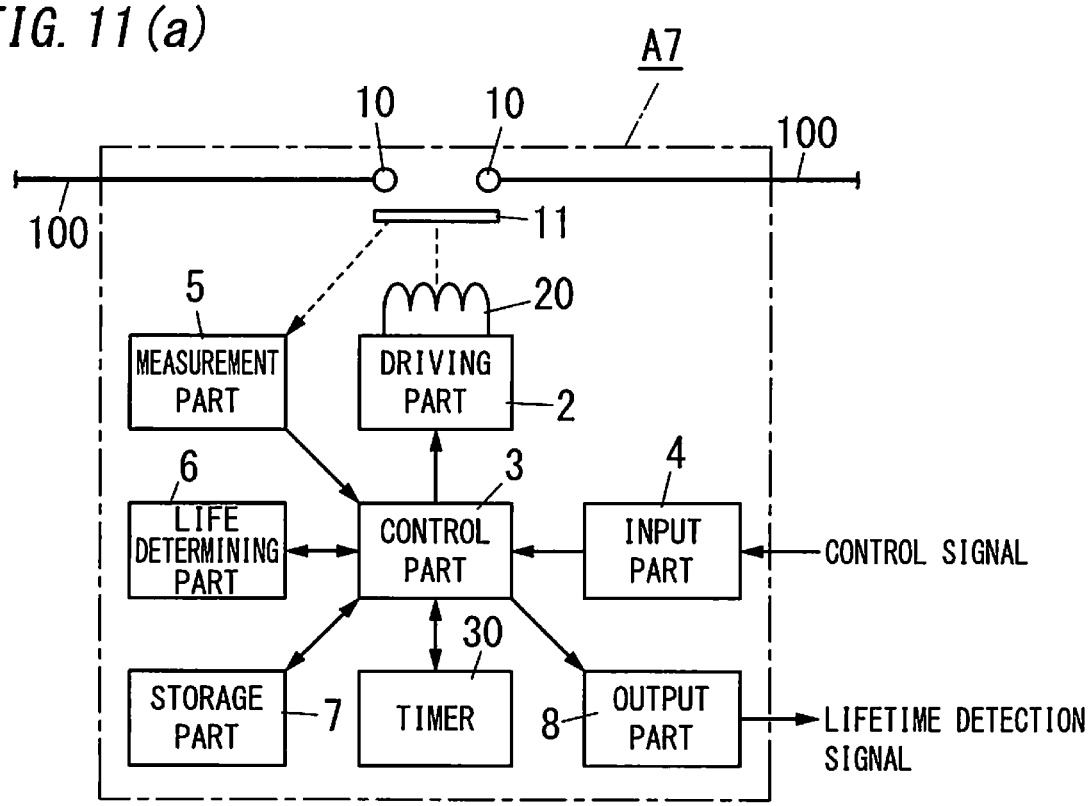
FIG. 11(a) is a block diagram illustrating a configuration according to Seventh Embodiment of the present invention.

As shown in FIG. 11(a), the basic configuration of an electromagnetic opening/closing device A7 according to the present embodiment is similar to that of the device according to the First Embodiment, except for including a timer 30. Therefore, such basic configuration elements are assigned with same reference numerals, and explanations thereof will be omitted appropriately.

In the state where the contact part 1 is being closed, a phenomenon that the contact part 1 is instantaneously opened and closed may occur when vibration or impact is applied from outside (hereinafter, called "chattering"). It is considered that the number of times this "chattering" occurs is increased depending on a factor, such as an exhaustion of the fixed contact 10 or the movable contact 11, a reduction in the spring force of the contact pressure spring or the like.

Figure 11B:
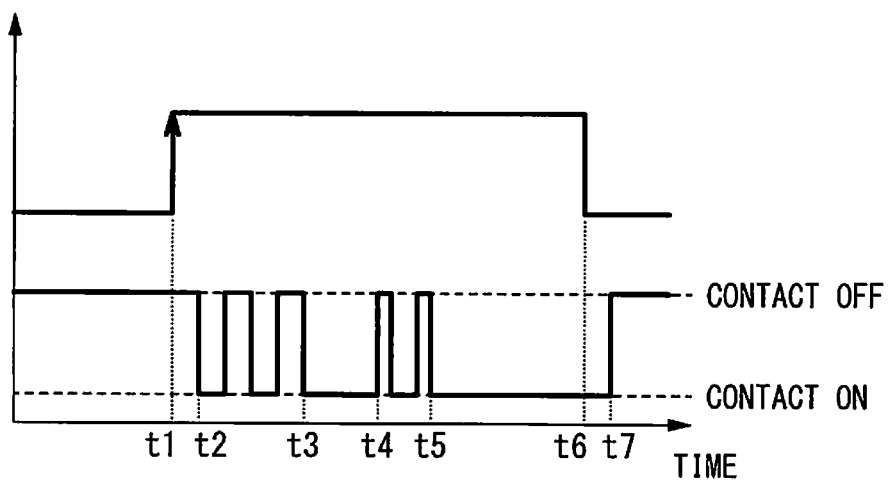
FIG. 11(b) is a diagram for explaining operation of a measurement part in the configuration according to the Seventh Embodiment of the present invention.

Therefore, in the present embodiment, the life determining part 6 is configured to determine the state (lifetime) of the contact part 1, based on the number of times the contact part 1 has been opened or closed per predetermined period. Here, as shown in FIG. 11(b), the predetermined period is a period (hereinafter, called "a control period for contact ON") between a time point t1 when the control signal for turning contact ON is inputted to the input part 4 and a time point t6 when the control signal for turning contact OFF is inputted. The timer 30 times the control period for contact ON. In this case, a time lag (t1 to t2) from when the control signal for turning contact ON is inputted to the input part 4 to when the contact part 1 is actually closed is called "an operating time", and a time lag (t6 to t7) from when the control signal for turning contact OFF is inputted to the input part 4 to when the contact part 1 is actually opened is called "a recovery time". Further, when the contact part 1 is opened or closed, an intermittent opening/closing phenomenon called "a contact bounce" occurs. This contact bounce is a phenomenon that invariably occurs resulting from the mechanism of the electromagnetic opening/closing device. As a result, it is desirable that the measurement part 5 be stopped from counting the number of times the contact part 1 is opened or closed caused by this contact bounce. Therefore, the measurement part 5 counts up, as one time in total, the number of times the contact part 1 has been opened or closed during a period (t1 to t3) until elapses of the operating time and a predetermined contact bounce period (t2 to t3).

The life determining part 6 compares the number of times the contact part 1 has been opened or closed during "the control period for contact ON", with the predetermined threshold value stored in the storage part 7, and then determines that the device does not reach end of life, while the number of times the contact part has been opened or closed is less than the threshold value. On the other hand, when the number of times the contact part has been opened or closed is equal to or more than the threshold value, the life determining part 6 determines that the device has reached the end of life.

Thus, the electromagnetic opening/closing device according to the present embodiment, as well as the other embodiments, can easily manage the lifetime compared with the conventional devices.

Here, it is considered that Joule heat is generated by making the excitation current flow to the excitation coil 20 and an insulating coating of the excitation coil 20 is gradually damaged by the Joule heat. Therefore, preferably, the life determining part 6 determines the lifetime, based on not only the number of times the contact part 1 has been opened or closed, but also a period during which the excitation current flows to the excitation coil 20, namely an accumulated time during which the contact part 1 is closed. In this case, the timer 30 times the accumulated time. The accumulated time stored in the storage part 7 is updated whenever the contact part 1 is opened. Further, in the case where the measurement part 5 measures the temperature of the excitation coil 20, the life determining part 6 may adjust a threshold value compared with the accumulated time, based on the measured temperature. For example, the life determining part 6 may adjust the threshold value so as to be smaller (shorter), as the temperature of the excitation coil 20 is increased.

Summarizing the above, in the electromagnetic opening/closing device A7 shown in FIG. 11(a), the determining means is configured to determine the state of the contact, based on the number of times the contact has been opened or closed per predetermined period.

In addition, the measurement means may be configured to measure the accumulated time during which the contact is closed.

EXPLANATION OF REFERENCE NUMERALS 1 contact part
3 control part (output means)
5 measurement part (measurement means)
6 life determining part (determining means)
8 output part (output means)

The invention claimed is:

1. An electromagnetic opening/closing device, opening or closing a contact in response to a command from outside, and comprising:
a measurement means configured to measure a number of times the contact has been opened or closed;
a determining means configured to determine a state of the contact, based on the number of times measured by the measurement means; and
an output means configured to output the determined result by the determining means to outside,
the determining means being configured to determine, as one time in total, the number of times measured by the measurement means during a period defined by the start of an operating time of the electromagnetic opening/closing device and the expiration of a predetermined contact bounce period.

2. The electromagnetic opening/closing device according to claim 1, wherein the measurement means is configured to measure the number of times the contact has been opened or closed, based on the number of times the command has been inputted.

3. The electromagnetic opening/closing device according to claim 1, further comprising an auxiliary contact interlocking with the opening/closing of the contact,
wherein the measurement means is configured to measure the number of times the contact has been opened or closed, based on the number of times the auxiliary contact has been opened or closed.

4. The electromagnetic opening/closing device according to claim 3,
wherein the determining means is configured to determine the state of the contact, based on the number of times the contact has been opened or closed per predetermined period.

5. The electromagnetic opening/closing device according to claim 1, further comprising an electromagnet,
wherein the contact comprises a fixed contact and a movable contact,
the electromagnet making the movable contact come into contact with or separate from the fixed contact, using electromagnetic force, and
wherein the measurement means is configured to measure the number of times the contact has been opened or closed, based on a change in an impedance of a coil that constitutes the electromagnet.

6. The electromagnetic opening/closing device according to claim 5,
wherein the determining means is configured to determine the state of the contact, based on the number of times the contact has been opened or closed per predetermined period.

7. The electromagnetic opening/closing device according to claim 1, further comprising a displacement means,
wherein the contact comprises a fixed contact and a movable contact,
the displacement means being configured to displace the movable contact, and
wherein the measurement means is configured to measure the number of times the contact has been opened or closed, based on the displacement of the movable contact by the displacement means.

8. The electromagnetic opening/closing device according to claim 7,
wherein the determining means is configured to determine the state of the contact, based on the number of times the contact has been opened or closed per predetermined period.

9. The electromagnetic opening/closing device according to claim 1, further comprising a displacement means,
wherein the contact comprises a fixed contact and a movable contact,
the displacement means being configured to apply an external force to displace the movable contact, and
wherein the measurement means is configured to measure the number of times the contact has been opened or closed, based on a strain caused by the external force applied by the displacement means.

10. The electromagnetic opening/closing device according to claim 9,
wherein the determining means is configured to determine the state of the contact, based on the number of times the contact has been opened or closed per predetermined period.

11. The electromagnetic opening/closing device according to claim 1, wherein the measurement means is configured to measure the number of times the contact has been opened or closed, based on a voltage applied across the contact.

12. The electromagnetic opening/closing device according to claim 11,
wherein the determining means is configured to determine the state of the contact, based on the number of times the contact has been opened or closed per predetermined period.

13. The electromagnetic opening/closing device according to claim 1,
wherein the measurement means is configured to measure an accumulated time during which the contact is closed.

* * * * *